(12) United States Patent
Golladay et al.

(10) Patent No.: US 6,353,231 B1
(45) Date of Patent: Mar. 5, 2002

(54) PINHOLE DETECTOR FOR ELECTRON INTENSITY DISTRIBUTION

(75) Inventors: Steven Douglas Golladay, Hopewell Junction, NY (US); Rodney Arthur Kendall, Ridgefield, CT (US); Michael Stuart Gordon, Lincolndale; Carl Emil Bohnenkamp, Hopewell Junction, both of NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/143,999

(22) Filed: Aug. 31, 1998

(51) Int. Cl.⁷ .............................................. H01J 37/304
(52) U.S. Cl. .................................................... 250/397
(58) Field of Search ................................ 250/347, 397, 250/361

(56) References Cited

U.S. PATENT DOCUMENTS

| | | | |
|---|---|---|---|
| 4,578,587 A | 3/1986 | Behringer et al. | 250/492.2 |
| 5,180,919 A | 1/1993 | Oae et al. | 250/492.2 |
| 5,430,292 A * | 7/1995 | Honjo | 250/310 |
| 5,825,035 A * | 10/1998 | Mizumura | 250/423 R |
| 5,939,720 A * | 8/1999 | Todokoro | 250/310 |
| 5,981,954 A * | 11/1999 | Muraki | 250/397 |

\* cited by examiner

*Primary Examiner*—Bruce Anderson
*Assistant Examiner*—Anthony Quash
(74) *Attorney, Agent, or Firm*—Graham S Jones, II (57) ABSTRACT

An instrument for measurement of illumination intensity distribution of an Electron Beam Projection System (EBPS) comprises a reticle with a clear subfield, a pinhole plate comprising a block of a low atomic number material with a high aspect ratio pinhole therethrough, the pinhole plate being positioned at the image plane of the EBPS. Means is provided for detecting electrons passing through the pinhole, and means is provided for moving, scanning, the pinhole with respect to a fixed electron intensity distribution or scanning the electron intensity distribution with respect to pinhole when held in a fixed position.

16 Claims, 5 Drawing Sheets

PINHOLE DETECTOR FOR ELECTRON INTENSITY DISTRIBUTION

BACKGROUND OF THE INVENTION

1. Field of the Invention

This invention relates to instruments for measurement of electron intensity distributions and more particularly to the measurement of illumination uniformity in electron beam projection systems.

2. Description of Related Art

Prior art pinhole electron detectors comprise a heavy metal barrier with an aperture (pinhole) through which electrons pass to a detector. A typical detector comprises a scintillator which emits light in response to electron impact and a photomultiplier tube to detect the light and electronically amplify the signal.

An image of an electron intensity distribution can be acquired by scanning the distribution across a pinhole detector. The spatial resolution of the resulting image or data is limited by the size of the pinhole and the extent to which the pinhole edges provide an abrupt transition between electron transmission and electron blockage. Electron stopping power increases with atomic number. For energetic electron beams (75 keV), a thickness of 5–10 micrometers of high atomic number material, e.g. Au, is sufficient to stop the electrons, whereas 100–125 micrometers of a low atomic number material, such as carbon, would be required. Heretofore, no techniques have existed to fabricate pinholes of several micrometers diameter in materials as thick as 100–125 micrometers, so pinholes were fabricated in heavy metals such as gold, platinum, and molybdenum.

U.S. Pat. No. 4,578,587 of Behringer et al. for "Error-Corrected Corpuscular Beam Lithography" shows a single hole diaphragm for accurately determining the shape of a thin tightly stretched foil mask by means of selected mask positions. A diaphragm having a hole of typically 0.5 $\mu$m (diameter or lateral length) is provided on the table outside of the support area for the wafer. Below the diaphragm, the single hole diaphragm and a scintillator are positioned. In the scintillator impinging electrons from the electron beam produce light flashes. The light flashes are fed to the photomultiplier. In a multihole arrangement the diaphragm used is a gold diaphragm and the holes, once again, are 0.5 $\mu$m in diameter or lateral length.

See U.S. Pat. No. 5,180,919 of Oae et al. for "Electron Beam Exposure System Having the Capability of Checking the Pattern of an Electron Mask Used for Shaping an Electron Beam" which passes a beam through a pattern of apertures in a block mask and through an aperture in a blanking aperture plate.

In the past, use has been made of conventional pinhole detectors for providing the required measurements. Use of such equipment to provide the signal required for a new Electron Beam Projection System (EBPS) system has been tried, but in the current state of the art the results have been unsatisfactory. These pinholes all cause significant backscattering of electrons which produces artifacts.

The artifacts preclude the measurements of electron intensity distribution with sufficient accuracy.

SUMMARY OF THE INVENTION

An advantage of this invention is that a pinhole plate formed of a material of low atomic number has low backscatter and reduces artifacts.

In accordance with this invention, an instrument for measurement of illumination intensity distribution comprises as follows:

a pinhole plate comprising a block of low atomic number material with a high aspect ratio pinhole therethrough, means for detecting electrons passing through the pinhole, and means for moving, scanning, the pinhole with respect to a fixed electron intensity distribution or scanning the electron intensity distribution with respect to pinhole when held in a fixed position.

In accordance with this invention, an instrument for measurement of illumination intensity distribution of an Electron Beam Projection System (EBPS) comprises as follows:

a reticle with a clear subfield, a pinhole plate comprising a block of low atomic number material with a high aspect ratio pinhole therethrough, said pinhole plate being positioned at the image plane of said EBPS, means for detecting electrons passing through said pinhole, and means for moving, scanning, the pinhole with respect to a fixed electron intensity distribution or scanning the electron intensity distribution with respect to pinhole when held in a fixed position.

BRIEF DESCRIPTION OF THE DRAWINGS

The foregoing and other aspects and advantages of this invention are explained and described below with reference to the accompanying drawings, in which:

FIG. 1B illustrates a plan view of the pinhole disk of

FIG. 1A showing the coaxial arrangement of the pinhole, the counterbore and the disk.

DESCRIPTION OF THE PREFERRED EMBODIMENT

We have studied measurements of electron intensity distributions obtained using conventional pinholes, and found that the measurement accuracy was degraded by detector artifacts. A series of experiments demonstrated that these artifacts were the result of electrons backscattered from the pinhole.

Carbon or other materials of low atomic number such as beryllium (Be), silicon (Si) or aluminum (Al) are known to cause very little backscattering. It is logical then that a pinhole plate (disk) made from carbon or other materials of low atomic number would reduce the detector artifacts and improve measurement accuracy. But a relatively thick layer (about 125 micrometers) of carbon is required to stop an energetic electron beam (75 kV). It is impossible by conventional drilling methods to drill a hole of 8–10 microns in diameter in a thickness of 125 microns of carbon or other elements or materials including compounds or mixtures of low atomic number.

Figure 1A:
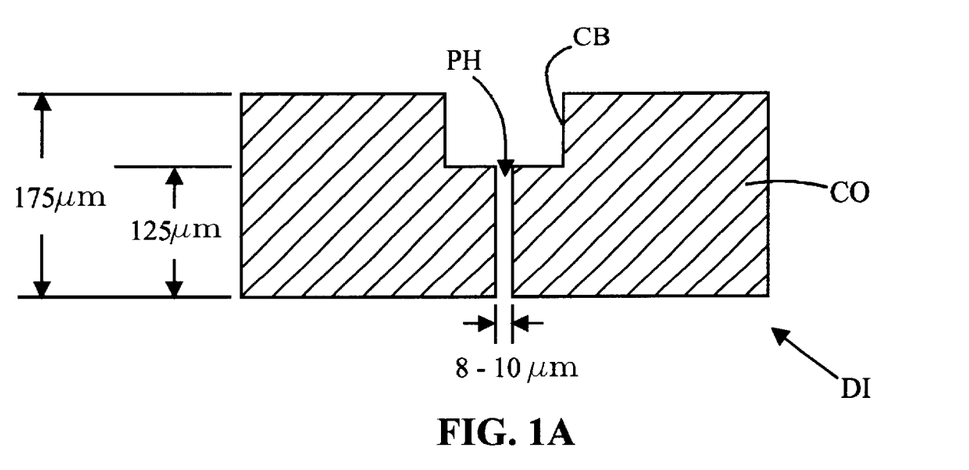
FIG. 1A illustrates a cross-sectional view of a pinhole disk with a central, small, high aspect ratio pinhole fabricated in accordance with this invention by ion beam milling.

FIG. 1A illustrates a cross-sectional view of disk DI with a pinhole PH fabricated in accordance with this invention by ion beam milling. The pinhole is formed in a solid carbon plate (disk) CO sufficiently thick to provide a robust structure which can be mounted to a holder. A thickness of 175 microns has been found to be sufficient for this purpose. Since we have determined that 125 microns of graphite is sufficient to stop a 75 keV beam, the central portion of the disk is reduced to this thickness by drilling using a conventional drill bit to create counterbore CB roughly coaxial with the carbon disk DI, thereby removing 50 microns of material. The pinhole is then fabricated coaxially with the drilled counterbore by ion beam milling. For the purpose of measuring the illumination uniformity in an EBPS, a pinhole diameter of 8–10 microns has proven satisfactory. The top surface of the plate CO is formed of carbon.

Figure 1B:
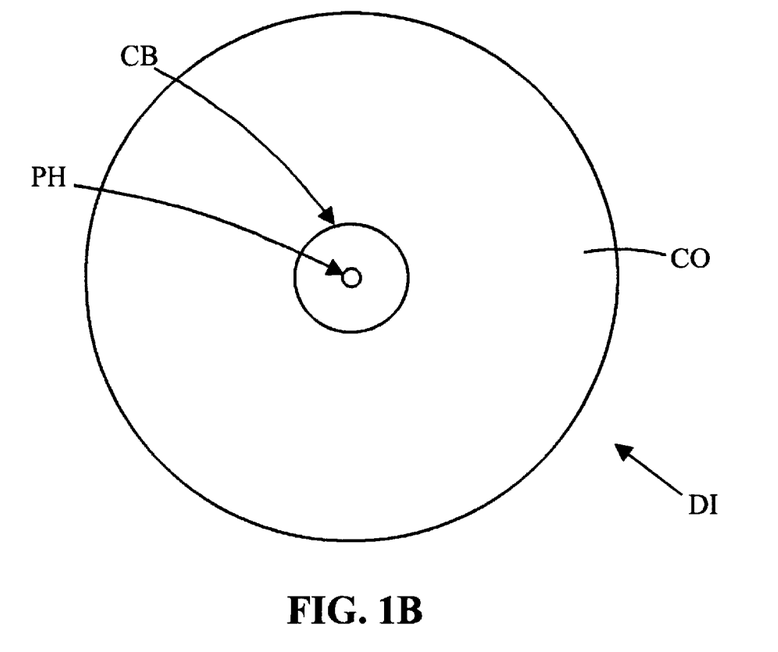

FIG. 1B illustrates a plan view of the disk DI of FIG. 1A showing the coaxial arrangement of the pinhole PH, the counterbore CB and the disk CO.

Figure 2A:
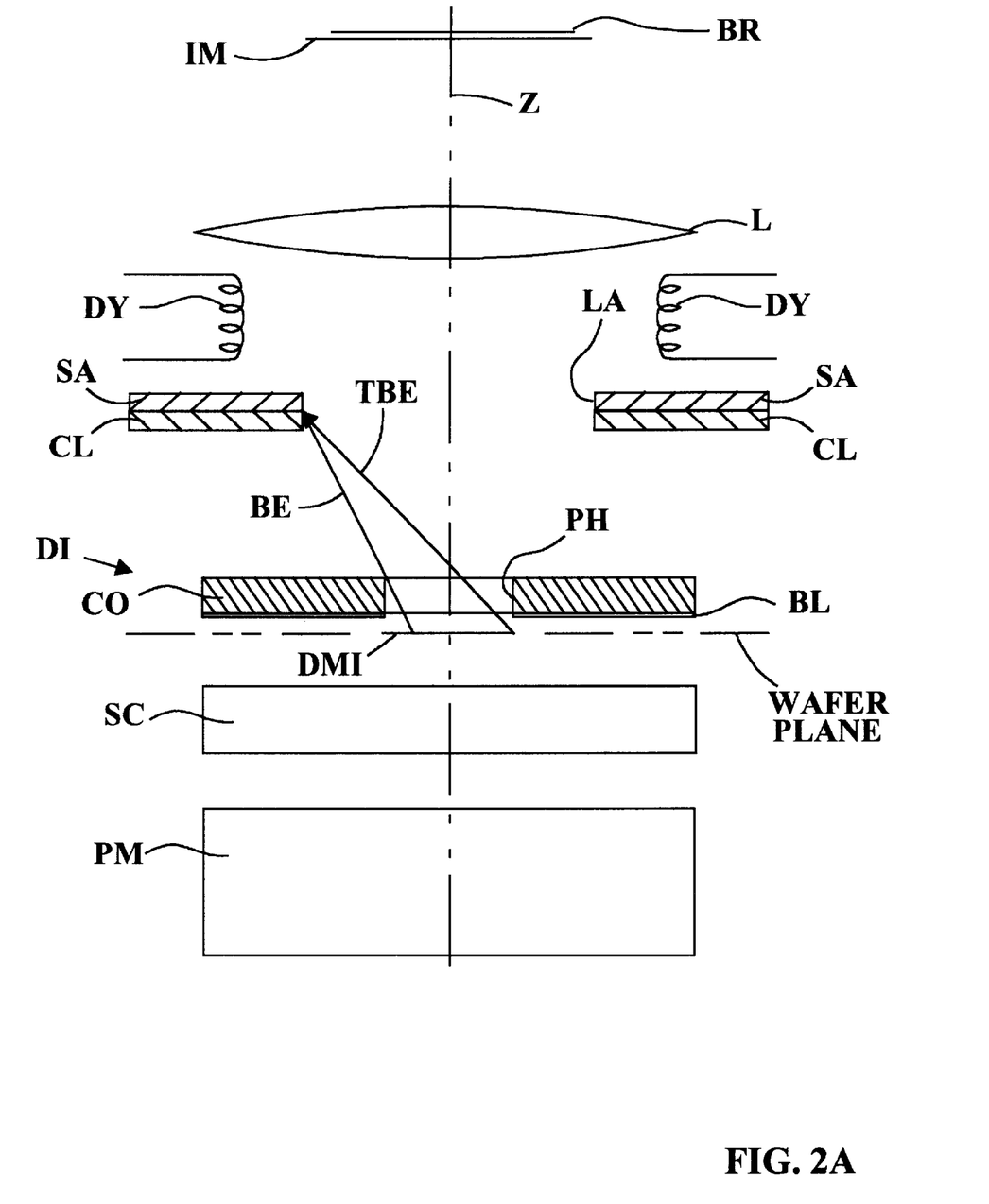
FIG. 2A is a schematic drawing illustrating the method and apparatus employed to measure the electron intensity distribution corresponding to the illumination intensity distribution of an EBPS using a pinhole disk at the target plus a scintillator, and a photo-multiplier tube.

FIG. 2A is a schematic drawing illustrating the method and apparatus employed to measure the electron intensity distribution of an EBPS.

For purposes of illustration we show schematically in FIG. 2 an EBPS of the kind proposed in U.S. Pat. No. 5,466,904 of Pfeiffer et al., wherein a pattern is written on a wafer by serial exposure of sub-sections of a reticle termed subfields. Through a combination of electronic beam deflection and mechanical motion of reticle and wafer stages, the complete pattern is built up from the subfields. The illumination system of such an EBPS (not shown) projects an electron intensity distribution onto a reticle sub-field BR. The imaging optics of the EBPS represented schematically by the lens L produces a demagnified image of the reticle, pattern on a wafer thereby effecting pattern transfer from the reticle to the wafer. Faithful replication of the reticle pattern at the wafer requires uniformity of the electron intensity distribution at the reticle of order 1%, and faithful imaging of this distribution to the wafer.

In situ electronic measurement of the uniformity of the electron intensity distribution is important in that it facilitates the proper adjustment of the illumination and/or imaging optics.

In a first preferred embodiment of the invention, the electron intensity distribution is measured at the wafer plane or target plane. In this case, a clear subfield, is included in the reticle and this subfield is positioned under the electron beam. The pinhole aperture PH is positioned at the plane of the target or wafer.

In the example of an embodiment shown in FIG. 2A, a pinhole PH is located in a disk DI which is located at tile target. In addition, a scintillator SC for detecting electrons passing through the pinhole PH, and a photo-multiplier tube PM for enhancing the output of the scintillator SC are provided. A square reticle BR provides an opening for the larger (darker) square image IM of electrons of electron beam EB arriving at the shaping aperture projected onto the reticle plane. For convenience of illustration, the square reticle BR is shown above the image IM. The image IM is projected through condenser lens L through the deflection yokes DY and through the optional slit aperture SA which is formed on an optional carbon layer CL with an optional aperture LA. The beam passes through the aperture LA down through the carbon overlayer CO which has the pinhole opening PH therethrough located at the target. The top surface of the overlayer CO comprises carbon.

Electrons which pass through the pinhole PH and hit the target pass on to the scintillator SC which then in turn passes the signals to the photomultiplier PM. The image IM is reduced in size to demagnified image DMI of the clear reticle subfield.

A monitor can be connected to the output of the photomultiplier PM.

An image showing the illumination uniformity is produced by deflecting the intensity distribution in a two dimensional raster scan over the fixed pinhole PH and displaying the detected signal with a corresponding raster scan.

Figure 2B:
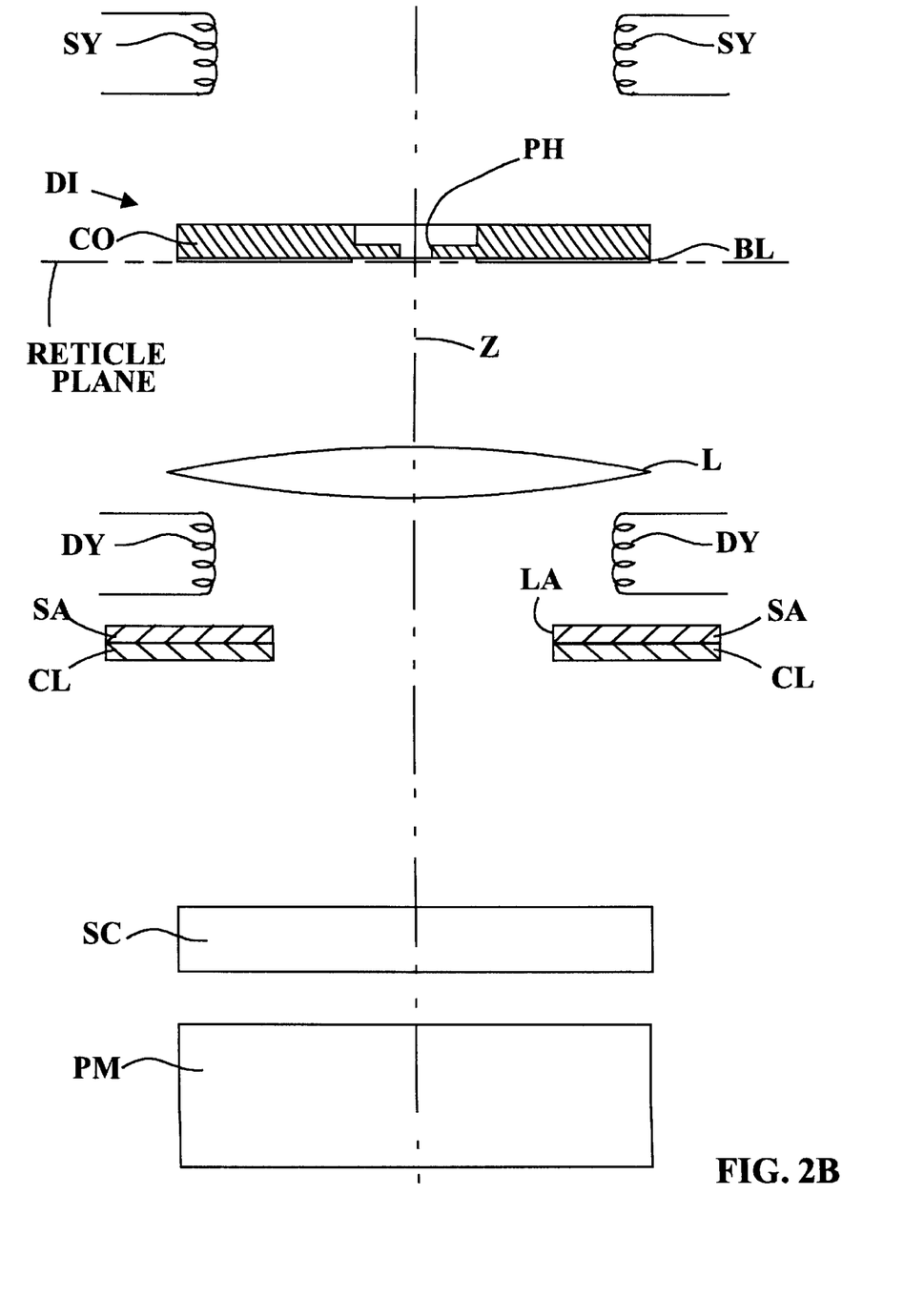
FIG. 2B is a schematic drawing illustrating the method of FIG. 2A modified to locate the pinhole plate in the form of a disk in the reticle plane.

Although in FIG. 2B, the scintillator SC is shown in close proximity to the pinhole PH, and the photomultiplier tube PM in close proximity to the scintillator SC, these elements can be separated, as long as electrons transmitted through the pinhole PH impact the scintillator SC, and the light emitted by the scintillator SC can be detected by the photomultiplier tube PM. In practice, it may be much more convenient to mount only the pinhole PH on the wafer stage, and to mount the scintillator SC and photomultiplier PM with electrical vacuum feedthrus in a fixed position beneath the wafer plane.

In a second preferred embodiment of the invention, the possibility of separating the pinhole PH from the scintillator SC is used to measure the electron intensity distribution at the reticle plane. In this case, the pinhole PH is is mounted on the reticle stage instead of on the wafer stage. The intensity distribution is scanned by deflection yokes above the reticle, or alternatively the reticle stage is moved relative to a fixed electron beams.

FIG. 2B is a schematic drawing illustrating the method of FIG. 2A modified to provide another example of an embodiment in accordance with this invention in which the pinhole disk DI is located in the reticle plane. At the top of FIG. 2B, a pair of scanning yokes are shown on either side of the centerline Z. The pinhole disk DI with a pinhole PH is shown between the scanning yokes and the condenser lens L. Following the condenser lens L are the deflection yokes DY slit aperture SA layer CL with aperture LA followed by scintillator SC and the photomultiplier PM.

We have studied the measurement of electron intensity distribution with a conventional pinhole PH of high atomic number (platinum).

A linescan through the image data studied showed that the intensity distribution appears to 'fall off' toward the edges, and there is extra signal 'outside' the illuminated area. A series of experiments proved that these signals were detector artifacts and not indicative of the actual illumination intensity distribution. A plausible explanation for these artifacts is based on detection of Backscattered Electrons BE and Twice Backscattered Electrons TBE which have been backscattered from the pinhole PH and backscattered a second time onto the scintillator SC as illustrated in FIG. 2.

The present invention overcomes these problems by utilizing a focussed ion beam system to fabricate a high aspect ratio pinhole PH in the substrate CO which is composed of a low atomic number material selected from the group consisting of aluminum, beryllium, silicon, and carbon. The high aspect ratio is essential to provide an abrupt transition between areas which transmit electrons and those which stop electrons.

FIG. 1A illustrates a cross-sectional view of a disk DI with a pinhole PH fabricated in accordance with this invention by ion beam milling.

FIG. 1B illustrates a plan view of the disk DI of FIG. 1A showing the coaxial arrangement of the pinhole PH, the counterbore CB and the disk CO.

Figure 3:
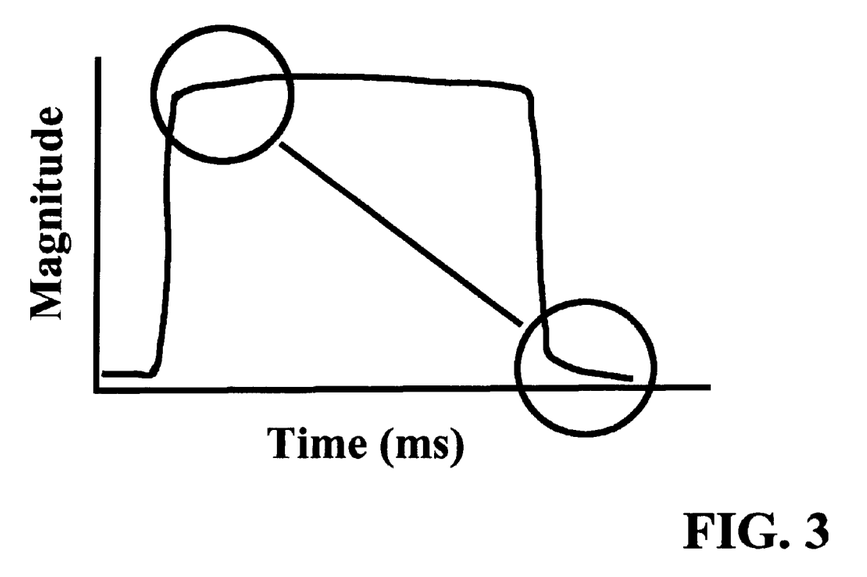
FIG. 3 illustrates for a given electron intensity distribution a line scan obtained with a conventional pinhole detector, where it can be seen that artifacts are present.

FIG. 3 illustrates the results obtained with a conventional pinhole of high atomic number (platinum) for a given electron intensity distribution, where it can be seen that artifacts are present. The "extra" intensity to the left of the steeply rising left edge roughly matches the intensity deficit seen on the right hand side of the peak signal. Both of these signals are detector artifacts which preclude uniformity measurements to one percent accuracy.

Figure 4:
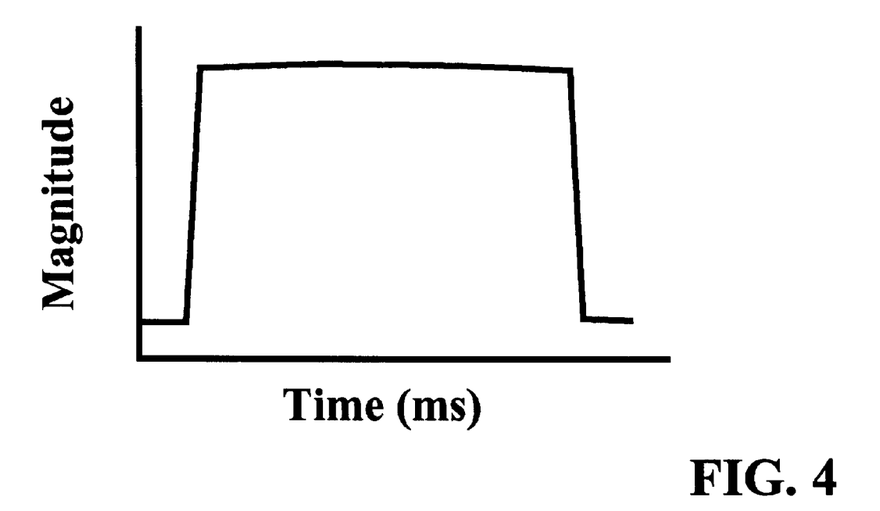
FIG. 4 illustrates the performance of the new carbon (preferably graphite) pinhole plate in the form of a disk under similar conditions to FIG. 3.

FIG. 4 illustrates the performance of the new carbon (preferably graphite) pinhole under similar conditions to FIG. 3. Note the absence of spurious signals outside the illumination area.

Figure 5A:
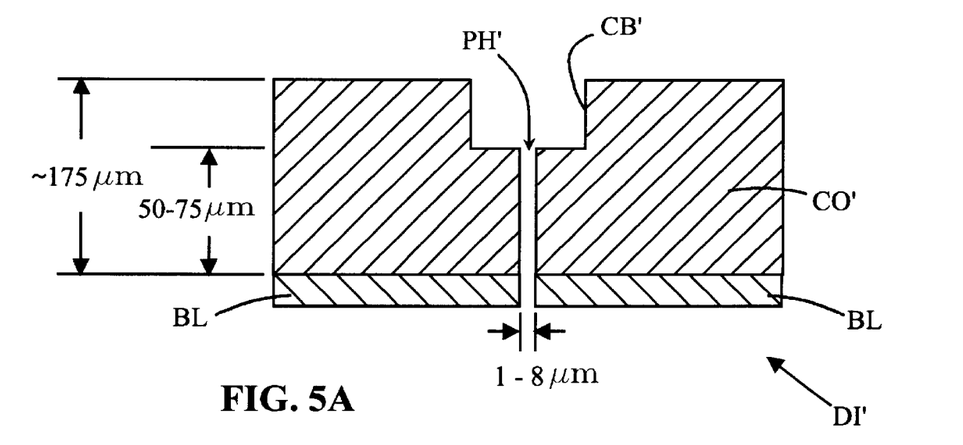
FIG. 5A illustrates a cross-sectional view of a modified pinhole plate in the form of a disk fabricated in accordance with this invention by ion beam milling, with a structure with a smaller pinhole with a diameter down to one micron or less which can be fabricated in accordance with this invention with a heavy metal bottom layer.
Figure 5B:
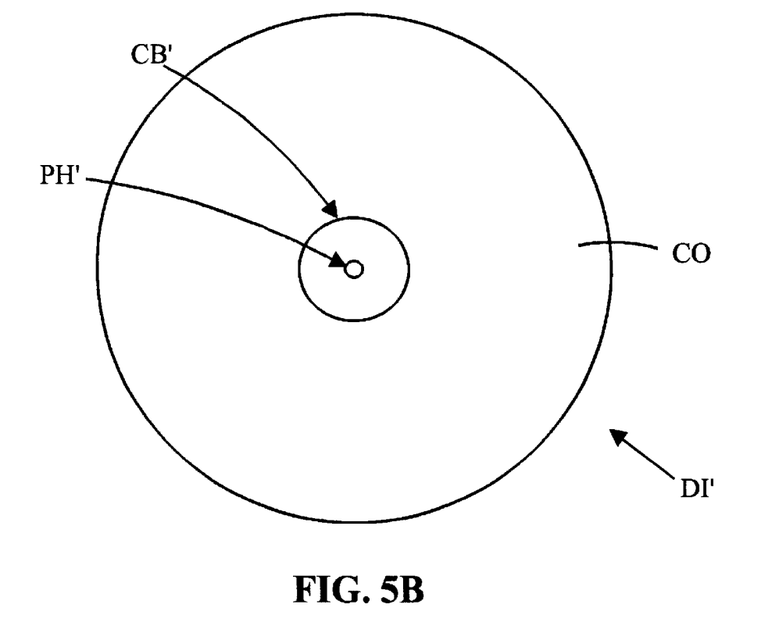
FIG. 5B illustrates a plan view of the pinhole disk of FIG. 5A showing the coaxial arrangement of the pinhole, the counterbore and the disk.

While we have demonstrated the method with a pinhole from about 8 micrometers to about 10 micrometers in diameter, FIGS. 5A and 5B shows a disk DI' with a structure with a smaller pinhole PH' with a diameter down to one micron or less which can be fabricated in accordance with this invention. For the highest resolution pinhole a heavy metal bottom layer BL, e.g. gold, platinum, molybdenum, etc., can be added to the bottom side (side opposite the incident beam) of the carbon (preferably graphite) by evaporative or other processes well known in the art to allow thinner carbon substrates while maintaining adequate beam stopping power, and still minimizing backscattering artifacts.

FIG. 5A illustrates a cross-sectional view of a modified pinhole disk fabricated in accordance with this invention by ion beam milling, with a structure with a smaller pinhole with a diameter down to one micron or less which can be fabricated in accordance with this invention with a heavy metal bottom layer. The top surface of the pinhole disk CO' of disk DI' is composed of graphite and only the bottom layer BL is composed of the heavy metal.

FIG. 5B illustrates a plan view of the pinhole disk of FIG. 5A showing the coaxial arrangement of the pinhole, the counterbore and the disk.

FIG. 5A illustrates a cross-sectional view of the disk DI' with a pinhole PH' fabricated in accordance with this invention by ion beam milling. The pinhole PH' has a diameter from about 1 $\mu$m to about 6 $\mu$m. The pinhole PH' is formed in a coaxial arrangement in a solid carbon (preferably graphite) disk CO' having a thickness of about 175 $\mu$m to provide a robust structure which can be mounted to a holder. A counterbore CB' coaxial with the carbon (preferably graphite) disk CO is formed in the top surface of the disk CO' by drilling using a conventional bit. The counterbore is about 100 $\mu$m to 125 $\mu$m deep. Then the ion milling process is performed to form the pinhole PH which is about 50 $\mu$m to 75 $\mu$m deep. Finally, a heavy metal bottom layer BL, e.g. gold, platinum, molybdenum, tantalum, tungsten, rhenium and uranium, etc. is added to the bottom side by evaporative or other processes well known to those skilled in the art. The thickness of the bottom layer is in the range from about 5 $\mu$m to about 10 $\mu$m depending on the beam energy of the electron beam to be measured. In summary, the top surface of the pinhole disk CO' of disk DI' is composed of graphite and only the bottom layer BL is composed of the heavy metal.

While a coaxial arrangement is shown, the important factor is that the pinhole is formed inside the plate with the low atomic number far from an edge thereof.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. In an Electron Beam Projection System (EBPS) with an image plane, an instrument for measurement of electron intensity distribution at said image plane comprising:

a reticle with a clear subfield located in a reticle plane of said EBPS, a pinhole plate located at a plane selected from said reticle plane and said image plane of said EBPS, said pinhole plate comprising a block with an exposed top surface and a body composed of a low atomic number material for providing minimal backscattering of electrons with said pinhole plate having a high aspect ratio pinhole extending from top to bottom therethrough through which electrons pass to detection means, said detection means detecting electrons passing through said pinhole in said pinhole plate, and motion means for moving/scanning, said pinhole and said pinhole plate with respect to a fixed electron intensity distribution or scanning the electron intensity distribution with respect to said pinhole plate when held in a fixed position, whereby measurement is achieved without creation of artifacts caused by backscattering of electrons from the top surface of the pinhole plate composed of the low atomic number material.

2. The instrument of claim 1 wherein said low atomic number material in said block of said pinhole plate consists of a carbon plate with a counterbore in said carbon plate, with said pinhole being formed inside said carbon plate far from an edge thereof.

3. The instrument of claim 1 wherein said low atomic number material in said block of said pinhole plate consists of carbon formed of a carbon plate having a thickness of about 175 $\mu$m, said pinhole is about 50 $\mu$m to about 75 $\mu$m long, with a diameter from about 8 $\mu$m to about 10 $\mu$m, and with a coaxial counterbore in said carbon plate, with said pinhole being formed inside said carbon plate far from an edge thereof.

4. The instrument of claim 1 wherein:

said low atomic number material in said block of said pinhole plate consists of a carbon plate having a thickness of about 175 $\mu$m, said pinhole is about 50 $\mu$m to about 75 $\mu$m long, with a diameter from about 1 $\mu$m to about 10 $\mu$m, and with a coaxial counterbore in said carbon plate, with said pinhole being formed inside said carbon plate far from an edge thereof, and said pinhole plate including a bottom layer positioned below said low atomic number material positioned opposite the surface for the incident beam with said pinhole extending through said bottom layer which is composed of a heavy metal for stopping electrons.

5. The instrument of claim 4 wherein said heavy metal in said bottom layer of said pinhole plate is selected from the group consisting of gold, platinum, tantalum, tungsten, rhenium and uranium and molybdenum.

6. In an Electron Beam Projection System (EBPS) with an image plane, an instrument for measurement of electron intensity distribution at said image plane comprising:
   a reticle with a clear subfield located in a reticle plane of said EBPS,
   a pinhole plate located at a plane selected from said reticle plane and said image plane of said EBPS, said pinhole plate comprising a block with an exposed top surface and a body composed of a low atomic number material for providing minimal backscattering of electrons with said pinhole plate having a high aspect ratio pinhole extending from top to bottom therethrough through which electrons pass to detection means,
   said detection means detecting electrons passing through said pinhole in said pinhole plate, and
   motion means for moving/scanning, said pinhole and said pinhole plate with respect to a fixed electron intensity distribution or scanning the electron intensity distribution with respect to said pinhole plate when held in a fixed position,
   whereby measurement is achieved without creation of artifacts caused by backscattering of electrons from the top surface of the pinhole plate composed of the low atomic number material, and
   said low atomic number material in said block of said pinhole plate is selected from the group consisting of aluminum, beryllium, silicon, and carbon.

7. An instrument for measurement of illumination intensity distribution of an Electron Beam Projection System (EBPS) including a reticle plane and an image plane comprising:
   a reticle with a clear subfield located at said reticle plane of said EBPS,
   a pinhole plate located at said image plane of said EBPS, said pinhole plate comprising a block with an exposed top surface and a body composed of a low atomic number material for providing minimal backscattering of electrons with said pinhole plate having a high aspect ratio pinhole extending from top to bottom therethrough through which electrons pass to detection means,
   said low atomic number material in said block of said pinhole plate is a material selected from the group consisting of aluminum, beryllium, silicon, and carbon,
   said pinhole plate being positioned at said image plane of said EBPS,
   said detection means detecting electrons passing through said pinhole of said pinhole plate, and
   motion means for moving, scanning, said pinhole in said pinhole plate with respect to a fixed electron intensity distribution; or motion means for scanning the electron intensity distribution with respect to said pinhole in said pinhole plate, when said pinhole in said pinhole plate is held in a fixed position,
   whereby measurement is achieved without creation of artifacts caused by backscattering of electrons from the top surface of the pinhole plate composed of the low atomic number material.

8. The instrument of claim 7 wherein said low atomic number material in said block of said pinhole plate consists of a carbon plate with a counterbore in said carbon plate, with said pinhole being formed inside said carbon plate far from an edge thereof.

9. The instrument of claim 7 wherein said low atomic number material in said block of said pinhole plate consists of a carbon plate having a thickness of about 175 $\mu$m, said pinhole is about 50 $\mu$m to about 75 $\mu$m long, with a diameter from about 8 $\mu$m to about 10 $\mu$m, and with a coaxial counterbore in said carbon plate, with said pinhole being formed inside said carbon plate far from an edge thereof.

10. The instrument of claim 7 wherein:
    said low atomic number material consists of a carbon plate having a thickness of about 175 $\mu$m, said pinhole is about 50 $\mu$m to about 75 $\mu$m long, with a diameter from about 1 $\mu$m to a bout 10 $\mu$m, and with a coaxial counterbore in said carbon plate, with said pinhole being formed inside said plate far from an edge thereof, and
    said pinhole plate includes a bottom layer positioned below said low atomic number material positioned opposite the surface for the incident beam with said pinhole extending through said bottom layer which is composed of a heavy metal for stopping electrons.

11. The instrument of claim 10 wherein said heavy metal in said bottom layer of said pinhole plate is selected from the group consisting of gold, platinum, tantalum, tungsten, rhenium, uranium, and molybdenum.

12. An instrument for measurement of illumination intensity distribution of an Electron Beam Projection System (EBPS) with a reticle plane comprising:
    a reticle with a clear subfield located at said reticle plane of said EBPS,
    a pinhole plate comprising a block with an exposed top surface and a body composed of carbon for providing minimal backscattering of electrons with said pinhole plate having a high aspect ratio pinhole extending from top to bottom therethrough through which electrons pass to detection means,
    said pinhole plate being positioned at said reticle plane of said EBPS,
    said detection means detecting electrons passing through said pinhole, and
    motion means for moving, scanning, said pinhole with respect to a fixed electron intensity distribution or scanning the electron intensity distribution with respect to said pinhole when said pinhole is held in a fixed position,
    whereby measurement is achieved without creation of artifacts caused by backscattering of electrons from the exposed top surface of the pinhole plate composed of the low atomic number material.

13. The instrument of claim 12 wherein said low atomic number material in said block of said pinhole plate consists of carbon formed of a carbon plate with a counterbore in which said pinhole is formed inside said plate far from an edge thereof.

14. The instrument of claim 12 wherein said low atomic number material in said block of said pinhole plate consists of carbon formed of a carbon plate having a thickness of about 175 $\mu$m, said pinhole is about 50 $\mu$m to about 75 $\mu$m long, with a diameter from about 8 $\mu$m to about 10 $\mu$m, and with a coaxial counterbore in which said pinhole is formed inside said plate far from an edge thereof.

15. The instrument of claim 12 wherein:
said low atomic number material in said block of said pinhole plate consists of carbon formed of a carbon disk having a thickness of about 175 $\mu$m, and said pinhole being about 50 $\mu$m to about 75 $\mu$m long, with a diameter from about 1 $\mu$m to about 10 $\mu$m, and with a coaxial counterbore in which said pinhole is formed coaxially with said disk and said counterbore, and said disk includes a bottom layer with said pinhole extending therethrough composed of heavy metal for stopping electrons.

16. The instrument of claim 15 wherein said heavy metal in said bottom layer of said disk is selected from the group consisting of gold, platinum, tantalum, tungsten, rhenium, uranium, and molybdenum.

* * * * *

UNITED STATES PATENT AND TRADEMARK OFFICE
CERTIFICATE OF CORRECTION

PATENT NO.    : 6,353,231 B1
DATED         : March 5, 2002
INVENTOR(S)   : Golladay et al.

It is certified that error appears in the above-identified patent and that said Letters Patent is hereby corrected as shown below:

Column 2,
Lines 34-36, please correct as follows:
"FIG. 1B illustrates a plan view of the pinhole disk of FIG. 1A showing the coaxial  arrangement of the pinhole,the counterbore and the disk."
by removing the indent on line 35 to read as follows: --
FIG. 1B illustrates a plan view of the pinhole disk of FIG. 1A showing the coaxial arrangement of the pinhole, the counterbore and the disk. --

Column 3,
Line 66, correct "located at tile" to read as follows: -- located at the --.

Signed and Sealed this

Twenty-sixth Day of November, 2002

*Attest:*

*Attesting Officer*

JAMES E. ROGAN
*Director of the United States Patent and Trademark Office*